(12) United States Patent
Shiotsuka et al.

(10) Patent No.: US 6,191,353 B1
(45) Date of Patent: *Feb. 20, 2001

(54) SOLAR CELL MODULE HAVING A SPECIFIC SURFACE SIDE COVER EXCELLING IN MOISTURE RESISTANCE AND TRANSPARENCY

(75) Inventors: Hidenori Shiotsuka, Nara; Takahiro Mori, Ikoma; Ichiro Kataoka; Satoru Yamada, both of Tsuzuki-gun; Ayako Shiotsuka, Nara, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/781,061

(22) Filed: Jan. 9, 1997

(30) Foreign Application Priority Data

Jan. 10, 1996 (JP) .................................................. 8-018281
Dec. 18, 1996 (JP) .................................................. 8-353802

(51) Int. Cl.$^7$ ....................................................... H01L 31/06
(52) U.S. Cl. ........................... 136/256; 136/257; 136/259
(58) Field of Search ..................................... 136/256, 257, 136/259

(56) References Cited

U.S. PATENT DOCUMENTS

| | | | |
|---|---|---|---|
| 2,183,256 | * 12/1939 | Gabler | 136/256 |
| 4,729,970 | 3/1988 | Nath et al. | 438/4 |
| 5,428,249 | * 6/1995 | Sawayama et al. | 257/746 |
| 5,650,019 | * 7/1997 | Yamada et al. | 136/251 |
| 5,681,402 | * 10/1997 | Ichinose et al. | 136/256 |

FOREIGN PATENT DOCUMENTS 6-196741  7/1994  (JP) .
6-338627  12/1994  (JP) .

* cited by examiner

Primary Examiner—Mark Chapman
(74) Attorney, Agent, or Firm—Fitzpatrick, Cellar, Harper & Scinto

(57) ABSTRACT

A solar cell module comprising a photovoltaic element having a light receiving face on which a collecting electrode having an electrically conductive coat and a surface side cover comprising a filler and a surface protective film sequentially laminated on the light incident side of said photovoltaic element, wherein a thin resin layer is interposed between said photovoltaic element and said filler such that gaps present in said conductive coat of the collecting electrode are filled by said thin resin layer.

19 Claims, 3 Drawing Sheets

SOLAR CELL MODULE HAVING A SPECIFIC SURFACE SIDE COVER EXCELLING IN MOISTURE RESISTANCE AND TRANSPARENCY

BACKGROUND OF THE INVENTION

1. Field of the Invention

The present invention relates to a solar cell module excelling especially in moisture resistance and transparency. More particularly, the present invention relates to a solar cell module improved so that the solar cell characteristics are effectively prevented from being deteriorated due to a reduction in the shunt resistance and the like of the photovoltaic element when used under environmental conditions with high temperature and high humidity over a long period of time.

2. Related Background Art

Recently, a number of solar cell modules have been proposed. FIG. 1 is a schematic cross-sectional view illustrating the constitution of a typical example of these solar cell modules. In FIG. 1, reference numeral 1101 indicates a photovoltaic element (or a solar cell) having a collecting electrode 1108, reference numeral 1102 a surface side filler, reference numeral 1103 a surface protective layer (or film), reference numeral 1105 a back side filler, reference numeral 1106 a insulating member, and reference numeral 1107 a support member (or a back face reinforcing member). Particularly, the surface protective layer 1103 comprises a fluororesin film such as an ethylene-tetrafluoroethylene copolymer (ETFE) film or polyvinyl fluoride (PVF) film; the surface side filler 1102 comprises ethylene vinyl acetate copolymer (EVA) or butyral resin; the back side filler 1105 comprises EVA (which is the same as the surface side filler 1102) or ethylene-ethyl acrylate copolymer (EEA); and the insulating member 1106 comprises a film of an organic resin such as nylon or polyethylene terephthalate (PET) or a member comprising an aluminum foil sandwiched with Tedlar (trademark name). In this solar cell module, the surface side filler 1102 serves also as an adhesive between the photovoltaic element 1101 and the fluororesin film as the surface protective layer 1103, and the back side filler 1105 serves also as an adhesive between the photovoltaic element 1101 and the insulating member 1106. The fluororesin film as the surface protective layer 1103 together with the surface side filler 1102 serve to prevent the photovoltaic element 1101 from being eternally damaged and from being damaged from external shock. The insulating member 1106 is disposed in order to reinforce the solar cell module while adding an appropriate rigidity thereto.

The collecting electrode 1108 of the photovoltaic element is usually formed by using a metallic wire coated by an electrically conductive composition or by way of screen printing of an electrically conductive paste.

In such solar cell module, EVA is usually used as the surface side filler 1102. And in order to sufficiently enclose the photovoltaic element 1101, a crosslinking agent such as 2,5-dimethyl-2,5-bis(t-butylperoxy)hexane (one-hour half life temperature: 138° C.) is incorporated into the EVA as the surface side filler. Besides this, it is known to use a peroxide compound capable of being decomposed at low temperature as the crosslinking agent for the EVA, where the EVA is crosslinked by way of decomposition of said peroxide compound at low temperature. In the case of using said peroxide compound as the crosslinking agent for the EVA as the surface side filler, in the lamination process for producing a solar cell module, the crosslinking of the EVA as the surface side filler proceeds at a high speed (this will be hereinafter referred to as high speed EVA crosslinking manner) and therefore, the heat treatment in the lamination process can be accomplished in a short period of time, resulting in reducing the period of time required for the lamination process. The use of the high speed EVA crosslinking manner provides other advantages since the heat treatment in the lamination process can be accomplished for a short period of time as above described, the quantity of heat energy applied to covering materials including the EVA as the surface side filler and a fluororesin film as the surface protective film in the heat treatment is relatively small so that the covering materials are prevented from being yellowed due to the heat energy applied. Therefore, the formation of a surface side cover excelling in optical initial characteristics can be attained for the photovoltaic element.

In the case of a solar cell module having the foregoing surface side cover excelling in optical initial characteristics formed by way of the high speed EVA crosslinking process, the fluororesin film which is present in the surface side cover as the surface protective film situated on the outermost surface side has a satisfactory water repelling effect for preventing moisture damage but it is difficult to attain a satisfactory moisture barrier function by the fluororesin film only. In addition, the photovoltaic element is sealed by the EVA having a high water absorbability which is situated under the fluororesin film. Because of this, the solar cell module is not sufficiently stable for the long-term case where the solar cell module is continuously used under environmental conditions with high temperature and high humidity. Further, in the case where the collecting electrode of the photovoltaic element comprises a metallic wire coated by an electrically conductive composition comprising particles of an electrically conductive material and a binder resin, the coat of the metallic wire is unavoidably accompanied by gaps present among the electrically conductive particles The gaps are left by insufficient filling with the binder resin. The metallic wire is therefore not sufficiently protected from contact with moisture.

Now, the high speed EVA crosslinking process is advantageous in that the EVA can be crosslinked in a short period of time, but it exhibits a problem in that the period of time during which the EVA is maintained in a fluidized state is short. Because of this, irregularities present at the photovoltaic element and the gaps present at the collecting electrode comprising the metallic wire coated by the electrically conductive composition are not sufficiently filled by the EVA and such irregularities and gaps provide unfilled defects in the solar cell module. This situation is liable to cause such problems as will be described as follows. When moisture invades the solar cell module, the moisture passes through said unfilled defects to reach the metallic wire of the collecting electrode. In this case, the metallic wire is oxidized to cause an increased series resistance (Rs) or/and the metal of the surface of the metallic wire is ionized or/and precipitated, when the photovoltaic element is in a voltage applied state. The ionized or precipitated metal migrates to deposits in the defects of the photovoltaic element, thus resulting in short circuits (or shunts) in the photovoltaic element. These deteriorate the photoelectric conversion performance of the solar cell module particularly when the solar cell module is continuously used under severe environmental conditions of high temperature and high humidity over a long period of time.

Further, for the collecting electrode comprising the metallic wire coated by the electrically conductive composition, when the moisture invaded the electrically conductive composition as above described, there is a tendency that the adhesion between the collecting electrode and the photovoltaic element gradually becomes inferior to provide an increased contact resistance between them, and the electric power generated by the photovoltaic element cannot be efficiently utilized over a long period of time.

Even in the case where the collecting electrode is formed by way of screen printing of an electrically conductive metal paste, the collecting electrode formed of the metal paste is liable to have gaps as well as in the case of the collecting electrode comprising the metallic wire coated by the electrically conductive composition. Therefore, there is a tendency that when moisture invades the solar cell module, there is a tendency that problems similar to the foregoing problems in the case of the collecting electrode comprising the metallic wire coated by the electrically conductive composition occur in that the metallic material of the collecting electrode is ionized or/and precipitated, and wherein the metal ionized or precipitated migrates to deposit in the defects of the photovoltaic element, resulting in causing short circuits (or shunts) in the photovoltaic element.

In addition, in the case where a glass fiber member is contained in the surface side filler comprising the EVA in order to make the surface side cover have an improved scratch resistance, a problem is liable to occur in that moisture often invades through the interface between the glass fiber member and the surface side filler, and it is difficult to sufficiently protect the photovoltaic element from moisture invasion.

Now, in the case of using EVA and a conventional crosslinking agent in combination as the surface side filler in the production of a solar cell module, since the period of time during which the EVA is crosslinked by the crosslinking agent is made to be relatively long, the EVA is maintained in a fluidized state for a relatively long period of time. Therefore, the irregularities present at the photovoltaic element and the gaps present in the collecting electrode are possible to be sufficiently filled by the EVA. However, if the gaps present in the collecting electrode could be sufficiently filled by the EVA, there is a tendency that since the EVA itself has a high water absorbability as above described, it is difficult to prevent collecting electrode suffering from moisture invasion. Hence, it is difficult to attain a solar cell module having an improved moisture resistance. Besides this, when the EVA by which the gaps of the collecting electrode are filled, contracts with the metallic wire of the collecting electrode, there is a tendency that the EVA is yellowed which creates a problem in that the quantity of light absorbed in the photovotaic element is diminished to cause a reduction in the photoelectric conversion efficiency provided by the photovoltaic element.

Further, in order to attain a solar cell module having an improved moisture resistance, there are a number of proposals to use a glass member as the outermost surface covering member of the solar cell module. According to these proposals, to use the glass member as the outermost surface covering member of the solar cell module makes it possible to prevent moisture invasion into the solar cell module from the surface side but it is difficult to sufficiently prevent moisture invasion into the solar cell module from the side faces thereof. In order to prevent the moisture invasion from the side faces of the solar cell module, there is known a manner of sealing the side faces of the solar cell module by means of a silicone sealant. However, the sealed side faces employing silicone sealant are poor in long-term moisture resistance and moisture once penetrating into the solar cell module barely released outside. The solar cell module having the outermost surface cover comprising the glass member, inferior in flexibility and shock resistance, and is weighty and costly.

In order to attain a solar cell module having an improved moisture resistance, there is known a manner of making the surface protective layer comprising an organic resin film such as a fluororesin film having an improved moisture resistance by depositing a film of $SiO_2$, $SiO_x$ or an alumina on at least one of the opposite surface of the organic film by means of the CVD sputtering process. However, the film deposited on the organic film as the surface protective layer is often colored so that it is poor in transparency and because of this, the resulting solar cell module is inferior in initial characteristics. Further in this case, the film deposited on the organic film as the surface protective layer is usually highly crystalline and therefore it is hard. Hence, the flexibility which is a representative feature of the film module is diminished, and the film deposited on the organic film as the surface protective layer is liable to crack to allow moisture invasion when the module is excessively bent. Therefore, this is not always effective in improving the moisture resistance of the solar cell module.

Now, a solar cell module is often used by installing it on a roof of a building. In this case, in order for the solar cell module to be used in a given country, the solar cell module must meet the requirements prescribed in the standard relating to roofing materials in that country. As one of the requirements, there is a combustion test. In order to pass the combustion test, the amount of the EVA belonging to a combustible resin which is used in the solar cell module as the sealing material must be decreased. However, in the case where the amount of the EVA used in such solar cell module as above described is decreased, the protective ability of the surface side cover to protect the photovoltaic element is diminished accordingly. In order to solve this problem, there is a proposal of reinforcing the EVA by means of a glass fiber member. In this proposal, there is employed a manner of disposing the glass fiber member in the surface side cover so that the surface side cover has an ability of protecting the photovoltaic element. In this case, it is necessary to use the EVA in such an amount that the glass fiber member can be sufficiently packed in the surface side cover. However, the solar cell module having such a surface side covering configuration is difficult to be approved that it is a roofing material belonging to Class A in the combustion test prescribed in UL 1703 Standard of the U.S.A.

SUMMARY OF THE INVENTION

An object of the present invention is to provide a solar cell module having an improved surface side cover which enables one to solve the foregoing problems in the prior art.

Another object of the present invention is to provide a solar cell module having an improved surface side cover excelling especially in moisture resistance and transparency.

A further object of the present invention is to provide a highly reliable solar cell module which slightly suffers from not only a reduction in the shunt resistance (Rsh) but also a rise in the series resistance (Rs) and continuously exhibits a desirable photoelectric conversion performance without being deteriorated, even upon the continuous use over a long period of time under severe environmental condition with high temperature and high humidity.

A further object of the present invention is to provide a highly reliable solar cell module comprising a photovoltaic element (or a solar cell) having a light receiving face on which a collecting electrode having an electrically conductive coat is disposed and a surface side cover comprising a filler and a surface protective film (comprising a surface transparent fluororesin film) sequentially laminated on the light incident side of said photovoltaic element, wherein a transparent thin resin layer is interposed between said photovoltaic element and said filler such that gaps present in said conductive coat of the collecting electrode are filled by said thin resin layer.

A further object of the present invention is to provide a highly reliable solar cell module comprising a photovoltaic element (or a solar cell) having a light receiving face on which a collecting electrode formed of an electrically conductive paste is disposed and a surface side cover comprising a filler and a surface protective film (comprising a transparent fluororesin film) sequentially laminated on the light incident side of said photovoltaic element, wherein a transparent thin resin layer is interposed between said photovoltaic element and said filler such that gaps present in said collecting electrode formed of said electrically conductive paste are filled by said thin resin layer.

In the present invention, the use of the specific thin resin layer in the surface side cover of a solar cell module provides various advantages as will be described below.

(1) There can be attained a surface side cover for a solar cell module. Particularly, the specific transparent thin resin layer may be formed by applying a given liquid resin on a photovoltaic element (or a solar cell) having a collecting electrode comprising a metallic wire coated by an electrically conductive composition composed of electrically conductive particles and a binder resin thereon to form a coat and curing said coat. In this case, gaps present in the coat of the collecting electrode without being filled by the binder resin are filled by the liquid resin and the liquid resin in said gaps are cured, where the gaps present in the coat of the collecting electrode are sufficiently filled. By this, the collecting electrode is prevented from suffering from moisture invasion therein. In more detail, the metallic wire constituting the collecting electrode is prevented from being oxidized by moisture, where the collecting electrode is prevented from suffering from not only a reduction in the shunt resistance (Rsh) but also a rise in the series resistance (Rs). Similar advantages are provided also in the case where the collecting electrode is formed by using an electrically conductive paste (a metal paste). Particularly, moisture invasion into the collecting electrode is effectively prevented, and in addition, precipitation of a metal ion and metal migration are effectively prevented.

(2) There can be attained a surface side cover excelling in initial translucency. Particularly, an appropriate resin can be selectively used as the surface side filler and the heat treatment in the lamination process for producing a solar cell module can be accomplished for a short period of time, where the materials used for the formation of a surface side cover for the solar cell module are prevented from being colored in the lamination process. Hence, there can be attained a solar cell module having an improved surface side cover excelling in initial translucency.

In addition, it is possible to use a crosslinking agent capable of decomposing at low temperature for crosslinking the surface side filler. In this case, the amount of the crosslinking agent remained without being decomposed in the surface side filler after the lamination process is greatly diminished and because of this, there can be attained a surface side cover for a solar cell module, which is free of a coloring problem due to the residual crosslinking agent.

Further, it is possible use a glass fiber member together with an adhesive of an acrylic resin in the surface side cover. In this case, EVA used as the surface side filler is prevented from being colored.

(3) There can be attained a surface side cover excelling in heat resistance for a solar cell module. Particularly, the use of the specific transparent thin resin layer in the surface side cover provides advantages in that there can be attain a surface side cover having an improved surface physical strength, and the amount of EVA used as the surface side filler can be diminished, where there can be attained a desirable solar cell module which can be approved that it is a roofing material belonging to Class A in the combustion test prescribed in UL 1703 Standard of the U.S.A.

(4) There can be attained a surface side cover having an improved scratch resistance for a solar cell module.

(5) There can be attained a surface side cover having an improved electrical insulating property for a solar cell module. Particularly, moisture invasion from the surface of the solar cell module on the light incident side is effectively prevented and because of this, the leakage of electric current to the outside is effectively prevented.

(6) There can be attained a surface side cover excelling in flexibility for a solar cell module. Particularly, it is possible to attain a surface side cover having a sufficient moisture resistant for a solar cell module without using a glass member, a deposited film or the like which are poor in flexibility. Hence, there can be attained a desirable solar cell module which is light weight and excels in shock resistance and moisture resistance.

(7) There can be attained a surface side cover excelling in exterior appearance for a solar cell module. Particularly, the specific transparent thin film resin layer is formed by using the liquid resin as above described. Upon the formation of this transparent thin resin layer, the uneven surface of the photovoltaic element can be smoothed and therefore, there can be attained a surface side cover excelling in exterior apprearance. Because of this, even in the case where the previously described high speed EVA crosslinking manner in which the period of time during which the EVA maintained in a fluidized state is short is employed, there can be attained a surface side cover with no packing deficiency and which excels in exterior appearance.

Further, the metallic wire constituting the collecting electrode is never contacted with EVA used as the surface side filler and because of this, the EVA is not colored. Hence, there can be attained a solar cell module having a desirable surface side cover having an excellent exterior appearance which is maintained without being deteriorated because the constituents of the surface side cover are not colored, where the solar cell module continuously exhibits a desirable photoelectric conversion performance without being deteriorated.

DESCRIPTION OF THE INVENTION AND PREFERRED EMBODIMENTS

The present invention will bedetailed with reference to embodiments which will be described below. It should be understood that the present invention is restricted by these embodiments.

Figure 1:
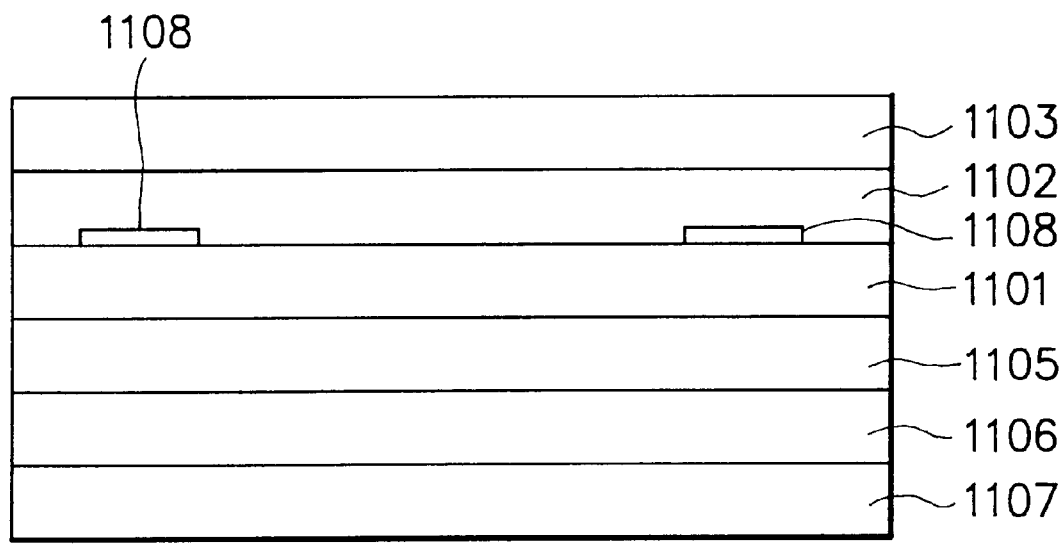
FIG. 1 is a schematic cross-sectional view illustrating an example of a conventional solar cell module.
Figure 2:
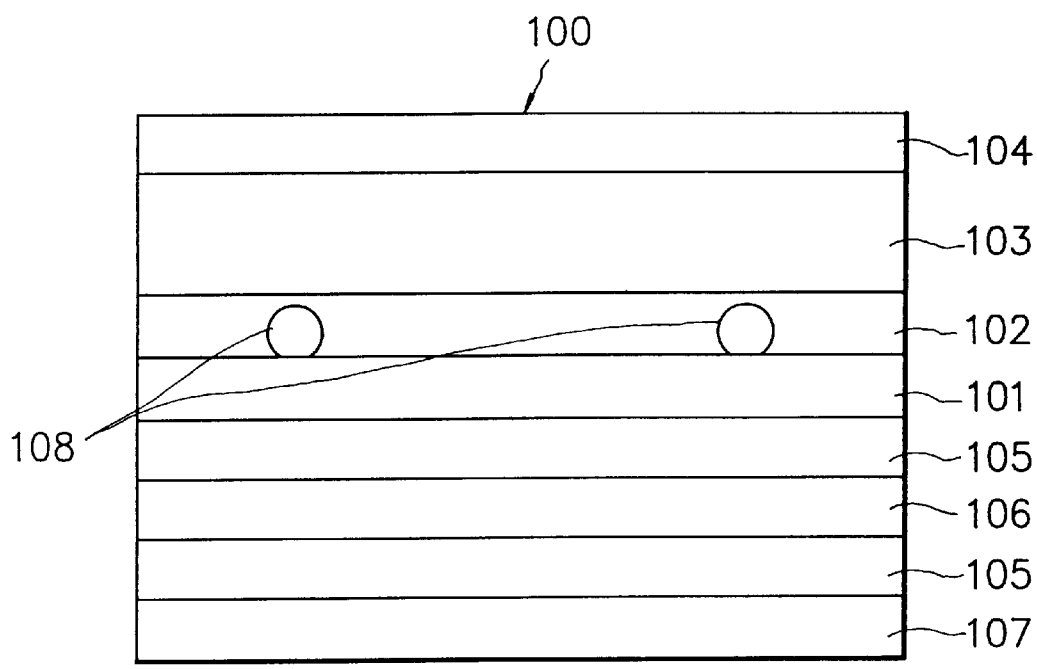
FIG. 2 is a schematic cross-sectional view illustrating an example of a solar cell module according to the present invention.

FIG. 2 is a schematic cross-sectional view illustrating the constitution of an example of a solar cell module according to the present invention.

In FIG. 2, reference numeral 101 indicates a photovoltaic element (or a solar cell) having a collecting electrode 108, reference numeral 102 a transparent thin resin layer, reference numeral 103 a surface side filler containing a glass fiber therein, reference numeral 104 a transparent or substantially transparent film which is positioned at the outermost surface (this film will be hereinafter referred to surface protective film or surface protective layer), reference numeral 105 a filler on the rear side of the photovoltaic element 101 (this filler will be hereinafter referred to as back side filler), reference numeral 106 an insulating film (or a back face protective film), and reference numeral 107 a back face reinforcing member. The back face reinforcing member 107 is not always necessary to be used. It may be used in case where necesarry.

In the solar cell module shown in FIG. 2, light 100 is impinged through the side of the surface protective film 104, and the light impinged passes through the surface protective film 104, the surface side filler 103 and the transparent thin resin layer 102 to arrive in the photovoltaic element 101. A photoelectromotive force generated in the photovoltaic element 101 is outputted through outputting terminals (not shown).

The photovoltaic element 101 comprises at least a semiconductor photoactive layer as a photoelectric conversion member disposed on an electroconductive substrate.

Figure 3:
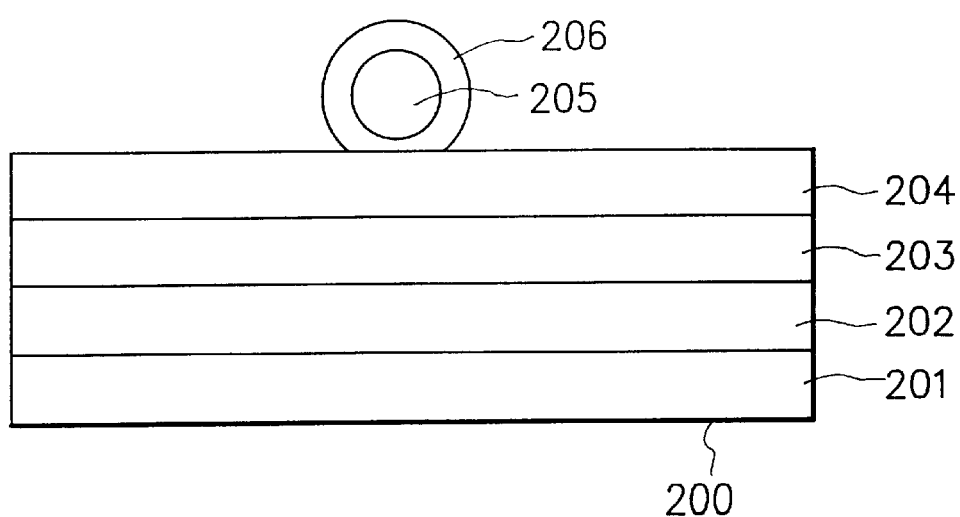
FIG. 3 is a schematic cross-sectional view illustrating an example of a photovoltaic element (or a solar cell) which can be used in the present invention.

FIG. 3 is a schematic cross-sectional view illustrating the constitution of such photovoltaic element.

In FIG. 3, reference numeral 201 indicates an electroconductive substrate, reference numeral 202 a back reflecting layer, reference numeral 203 a photoactive semiconductor layer, reference numeral 204 a transparent and electrically conductive layer, reference numeral 205 a collecting electrode (or a grid electrode), and reference numeral 206 a coat formed using an electrically conductive paste by which the collecting electrode 205 is coated.

The photovoltaic element shown in FIG. 3 comprises the back reflecting layer 202, the photoactive semiconductor layer 203, the transparent and electrically conductive layer 204 disposed in the named order on the electroconductive substrate 201. The collecting electrode 205 with the coat 206 is disposed on the surface of the transparent and electrically conductive layer 204. And the photovoltaic element shown in FIG. 3 has a pair of power outputting terminals (not shown). One of the two power outputting terminals is electrically connected to the collecting electrode 205 and it is extending from the collecting electrode 205 while being insulated by means of an insulating member (not shown), and the other power outputting terminal is electrically connected to the electroconductive substrate 201. In this configuration, the positive side power outputting terminal and the negative side power outputting terminal may be changed into a negative side power outputting terminal and a positive side power outputting terminal depending upon the constitution of the photoactive semiconductor layer.

Figure 4:
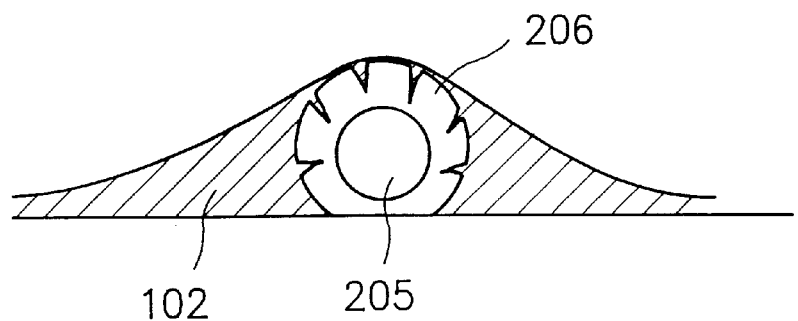
FIG. 4 is a schematic cross-sectional view illustrating an example of a configuration of a thin film resin layer formed at a collecting electrode in the present invention.

FIG. 4 is a schematic cross-sectional view illustrating an example of a configuration in the case where the transparent thin resin layer 102 (see, FIG. 2) is formed on the light receiving surface of the photovoltaic element shown in FIG. 3 so as to enclose the collecting electrode 205 with the coat 206. As shown in FIG. 4, the transparent thin resin layer 102 is formed such that gaps present in the coat 206 are filled by the transparent thin resin layer. As long as the gaps present in the coat 206 are filled by the transparent thin resin layer, it is not necessary for the transparent thin resin layer to be formed on the entire area of the light receiving face of the photovoltaic element. For the thickness of the transparent thin resin layer, it may be properly determined depending upon the situation involved. For instance, it may be thinner that the thickness of the collecting electrode including the coat. Specifically, the transparent thin resin layer is desired to be formed such that it has a thickness in the range of from 0.5 to 150 μm over the coat by which the collecting electrode is covered.

In the following, description will made of each of the constituents of the solar cell module according to the present invention will be detailed.

As above described, as the photovoltaic element 101 in the solar cell module according to the present invention, a photovoltaic element having the constitution shown in FIG. 3 may be desirably used.

Detailed escription will be made of the photovoltaic element shown in FIG. 3.

The electrically conductive substrate 201 serves not only as a substrate for the photovoltaic element but also as a lower electrode. As for the electrically conductive substrate 201, there is no particular restriction as long as it has an electrically conductive surface. Specifically, it may be comprised of a metal such as Ta, Mo, W, Cu, Ti, Al, or the like, or an alloy of these metals as stainless steel. Other than these, the electrically conductive substrate may comprise a carbon sheet or a Pb-plated steel sheet. Alternatively, the electrically conductive substrate may be a film or sheet made of a synthetic resin or a sheet made of a ceramic. In this case, the substrate is deposited with an electroconductive film of $SnO_2$, $ZnO_2$, ITO, or the like on the surface thereof.

The back reflecting layer 202 disposed on the electrically conductive substrate 201 may comprise a metal layer, a metal oxide layer, or a two-layered structure comprising a metal layer and a metal oxide layer. The metal layer may be composed of a metal such as Ti, Cr, Mo, W, Al, Ag, Ni, or the like. The metal oxide layer may comprise any of oxides of said metals, or other metal oxide such as ZnO, $SnO_2$, or the like.

The back reflecting layer 202 is desired to have a roughened surface in order to make incident light to be effectively utilized.

The back reflecting layer 202 may be formed by a conventional film-forming technique such as resistant heating evaporation, electron beam evaporation, or sputtering.

The photactive semiconductor layer 203 functions to conduct photoelectric conversion. The photoactive semiconductor layer may be composed of a single crystal silicon semiconductor material, a non-single crystal silicon semiconductor material such as an amorphous silicon semiconductor material (including a microcrystalline silicon semiconductor material) or polycrystalline silicon semiconductor material, or a compound semiconductor material. In any case, the photoactive semiconductor layer comprised of any of these semiconductor materials may be of a stacked structure with a pin junction, a pn junction or a Shottky type junction.

Specific examples of the compound semiconductor material are $CuInSe_2$, $CuInS_2$, GaAs, $CdS/Cu_2S$, CdS/CdTe, CdS/InP, $CdTe/Cu_2Te$, and the like.

The photoactive semiconductor layer comprised of any of the above mentioned semiconductor materials may be formed by a conventional film-forming technique. For instance, the non-single crystal silicon photoactive semiconductor layer may be formed by a conventional chemical vapor phase growing technique such as plasma CVD or light-induced CVD using proper film-forming raw material gas capable of imparting silicon atoms such as silane gas or a conventional physical vapor phase growing technique such as sputtering using a Si-target. The photoactive semiconductor layer composed of a polycrystalline silicon semiconductor material may be formed by a conventional polycrystalline silicon film-forming manner of providing a fused silicon material and subjecting the fused silicon material to film-making processing or another conventional polycrystalline silicon film-forming manner of subjecting an amorphous silicon material to heat treatment.

The photoactive semiconductor layer composed of any of the above mentioned compound semiconductor materials may be formed by a conventional ion plating, ion beam deposition, vacuum evaporation, sputtering, or electrolytic technique in which a precipitate is caused by way of electrolysis of a desired electrolyte.

The transparent and electrically conductive layer 204 functions as an upper electrode. The transparent and electrically conductive layer may comprise $In_2O_3$, $SnO_2$, ITO ($In_2O_3$—$SnO_2$), ZnO, $TiO_2$, or $Cd_2SnO_4$. Other than this, it may comprise a crystalline semiconductor layer doped with an appropriate impurity with a high concentration.

The transparent and electrically conductive layer constituted by any of the above mentioned materials may be formed by a conventional resistant heating evaporation, electron beam evaporation, sputtering, spraying, or CVD.

The above described impurity-doped crystalline semiconductor layer as the transparent and electrically conductive layer may be formed by a conventional impurity-diffusion film-forming process.

By the way, for a photovoltaic element obtained by forming a back reflecting layer, a photoactive semiconductor layer and a transparent and electrically conductive layer in the named order on an electrically conductive substrate, it is sometimes accompanied by short circuit defects that the electrically conductive substrate and the transparent and electrically conductive layer are partially short-circuited due to unevenness of the electrically conductive substrate or/and unevenness of the photoactive semiconductor layer occurred in its formation. There is a tendency for the photovoltaic element having such short circuit defects to have a state with a small leak resistance (or a small shunt resistance) that a large leakage current is flown in proportional to the output voltage. U.S. Pat. No. 4,729,970 discloses a manner of removing short circuit defects present in a photovoltaic element. It is possible to make the photovoltaic element having such short circuit defects into a defect-free photovoltaic element by repairing it in accordance with the manner described said patent document. In general, a photovoltaic element is usable as long as it has a shunt resistance as required, for instance, of 1 $k\Omega.cm^2$ or more, preferably 10 $k\Omega.cm^2$ or more.

The collecting electrode (or the grid eletrode) 205 is disposed on the transparent and electrically conductive layer 204 in order to effectively collect an electric current.

In the photovoltaic element shown in FIG. 3, the collecting electrode 205 is covered by the electrically conductive coat 206. This may be formed by a manner of providing a metallic wire with a resistivity of $10^{-4}$ $\Omega cm$ made of a metal such as Al, Ag, Au, Ni, Cu, Sn, or Pt as the collecting electrode 205 and coating said metallic wire by an electrically conductive paste (as the electrically conductive coat 206) comprising particles of an electrically conductive material (hereinafter referred to as electrically conductive particles) dispersed in a binder resin. As the electrically conductive particles, there can be mentioned Ag fine powder, Au fine powder, Cu fine powder, Ni fine powder, and carbon fine powder. As the binder resin, there can be mentioned polyester resin, epoxy resin, acrylic resin, alkyd resin, polyvinyl acetate, rubber, urethane resin, phenol resin, butyral resin, and phenoxy resin.

For the thickness of the coat 206, it is preferably in the range of from 1 $\mu$m to 100 $\mu$m, more preferably in the range of from 1 $\mu$m to 50 $\mu$m. In the case where the thickness of the coat 206 is less than 1 $\mu$m, a problem is liable to entail in that it is difficult to fix the collecting electrode 205 comprising the metallic wire onto the transparent and electrically conductive layer 204 with a sufficient adhesion. In the case where the thickness of the coat 206 is beyond 100 $\mu$m, a problem is liable to entail in that the light receiving surface of the photovoltaic element is excessively shielded and as a result, the quantity of light impinged into the photovoltaic element is diminished to reduce the photoelectric conversion efficiency.

The collecting electrode in the photovoltaic element used in the present invention is not limited to the one shown in FIG. 3 but it may be a collecting electrode formed by other manner.

Specifically, there can be illustrated a collecting electrode formed by screen printing an electrically conductive paste of a metal such as Ti, Cr, Mo, W, Al, Ag, Ni, Cu or Sn using a mask pattern; a collecting electrode formed by fixing the above-described metallic wire to the screen printed electrically conductive paste by means of a solder; and a collecting electrode formed by a manner of forming a metal film of any of the above-mentioned metals over the entire surface by the conventional sputtering or CVD process and subjecting the metal film to etching treatment to form a desired pattern.

The foregoing pair of power outputting terminals (not shown in the figure) serve to output an electromotive force. One of the two power outputting terminal is electrically connected to the collecting electrode by means of, for instance, an electroconductive paste. Althernatively, the electrical connection in this case may be conducted by using an appropriate connecting metal body and an electroconductive paste or solder.

The remaining power outputting terminal is electrically connected to the electroconductive substrate by means of, for instance, a solder. Alternatively, the electrical connection in this case may be conducted by spot welding or soldering an appropriate metal body such as copper tab.

There are provided a plurality of photovoltaic elements having the above constitution, and they are integrated in series connection or in parallel connection depending upon a desired voltage or electric current. It is possible to dispose the integrated body on an insulating member such that a desired voltage or electric current can be obtained.

Now, description will be made of other constituents than the photovoltaic element 101 in FIG. 2.

Surface Protective Film

The surface protective film 104 is positioned at the outermost surface of the solar cell module. Because of this, the surface protective film is required to excel in transparency, weatherability, water repellency, pollution resistance, and physical strength. In addition, in the case where the solar cell module is used outdoors, it is required for the surface protective film to ensure that the solar cell module has sufficient durability upon the continuous use over a long period of time.

Therefore, the surface protective film is comprised of an adequate transparent resin film which satisfies these requirements. Such film can include films of fluororesins such as ETFE (tetrafluoroethylene-ethylene copolymer), PVF (polyvinyl fluoride resin), PVDF (polyvinylidene fluoride resin), TFE (polytetrafluoroethylene resin), FEP (tetrafluoroethylene-hexafluoropropylene copolymer), and CTFE (polychlorotrifluoroethylene resin). Of these, PVF film is superior in terms of weatherability, FEP film and CTFE film are superior in terms of moisture resistance, and ETFE film is superior in terms of weatherability and physical strength in combination.

In order to attain a further improvement in the adhesion of the surface protective film with the surface side filler, a given surface of the surface protective film to be contacted with the surface side filler is desired to be subjected to surface treatment by way of corona discharge treatment, plasma treatment, ozone treatment, UV irradiation treatment, electron beam irradiation treatment, or flame treatment.

Surface Side Filler

The surface side filler 103 serves to cover the irregularities present at the surface of the photovoltaic element, to prevent the photovoltaic element from being influenced by external factors such as temperature changes or/and humidity changes in the external environment, impacts externally applied, or the like and to attain a sufficient adhesion between the photovoltaic element and the surface protective film. Hence, the surface side filler is required to be highly transparent and excel especially in weatherability, adhesion, packing property, heat resistance, cold resistance, and impact resistance. In order for the surface side filler to meet these requirements, the surface side filler is comprised of a resin selected from the group consisting of resins of copolymers comprising ethylene and unsaturated acid ester. Specific examples of such copolymer resin are EVA (ethylene-vinyl acetate copolymer), EMA (ethylene-methyl acrylate copolymer), EEA (ethylene-ethyl acrylate copolymer), EBA (ethylene-butyl acrylate copolymer), EMM (ethylene-methyl methacrylate copolymer), and EEM (ethylene-ethyl methacrylate copolymer). Of these resins, EVA is the most desirable because it exhibits well-balanced physical properties suitable for a solar cell when used as the surface side filler.

Any of the above mentioned resins usable as the surface side filler (this resin will be hereinafter referred to as filler resin) is low in heat deformation temperature and it is liable to readily deform or creep at a high temperature. Because of this, the filler resin is desired to be crosslinked with an appropriate crosslinking agent so that it has an increased heat resistance and an increased adhesion. As such crosslinking agent, there can be mentioned isocyanates, melamines, and organic peroxides.

In the present invention, it is desired to use such a crosslinking agent that has a sufficiently long pot life, is capable of quickly causing crosslinking reaction upon crosslinking the filler resin, and causes no free material or only a slight amount of said free material because the surface protective film is laminated on the filler resin as the surface side filler.

To use a crosslinking agent comprising an organic peroxide is the most appropriate since the organic peroxide can desirably meet the above conditions.

Therefore, description will be made of the organic peroxide used as the crosslinking agent.

The crosliking of the filler resin used as the surface side filler using the organic peroxide as the crosslinking agent is performed by way of drawing hydrogen atoms or halogen atoms in the resin by virtue of free radicals generated from the organic peroxide to form C—C bonds.

In order to make the organic peroxide to generate such free radicals upon crosslinking the filler resin, the organic peroxide is desired to be activated by means of the thermal decomposition process, redox decomposition process, or ion decomposition process. Of these processes, the thermal decomposition process is the most appropriate.

For the decomposition temperature of the organic peroxide, it is desired to be in the range of from 100° C. to 130° C. In the case where the decomposition temperature is less than 100° C., when EVA is used as the surface side filler, a problem is liable to entail in that because the dissolution temperature of the EVA is close to the decomposition temperature of the organic peroxide, the period of time during which the EVA maintained in a fluidized state is too short to cover the irregularities present at the surface of the photovoltaic element in a desirable state. In the case where the decomposition of the organic peroxide is beyond 130° C., a problem is liable to entail in that the temperature in the heat treatment for crosliking the EVA in the lamination process for producing a solar cell module is necessary to heightened and the period of time for the heat treatment is necessary to prolong, where an excessive quantity of heat energy is applied to the EVA and because of this, the EVA is likely to be yellowed.

Preferable examples of the organic peroxide used as the crosliking agent are t-butylperoxyisobutylcanboate, 1,1-di-(t-butylperoxy)-3,3,5-trimethylcyclohexane, and di-t-butylperoxyhexahydrotetrephthalate.

The amount of such organic peroxide as the crosslinking agent to be added to the filler resin as the surface side filler is desired to be preferably in the range of from 0.1 to 5 wt. % versus the filler resin.

The organic peroxide as the crosslinking agent may be used together with the filler resin as the surface side filler upon thermocompression-bonding the filler, wherein the filler is bonded to the photovoltaic element and also to the surface protective layer while being crosslinked with the organic peroxide. Conditions of the temperature and the period of time for the thermocompression-bonding treatment in this case may be properly determined depending upon the thermodecomposition temperature of the organic peroxide used. However, in general, these conditions are properly determined to be such that 60% or more or preferably, 95% or more of the organic peroxide in the filler resin is thermally decomposed, wherein the filler resin is subjected to themocompression-bonding to the photovoltaic element and to the surface protective layer while being crosslinked. The thermocompression-bonding treatment may be conducted by a compression manner using heated roll or hot press or by a thermocompression manner using a lamination instrument of an air back system in which an object to be treated is placed in the air back system and the inside of the air back system is vacuumed to press the object by way of atmospheric pressure.

In order to facilitate the crosslinking reaction of the filler resin as the surface side filler by means of the crosslinking agent, it is possible to use a crosslinking accelerator such as triallyl cyanurate together with the crosslinking agent. For the amount of said crosslinking accelerator to be added, it is desired to be in the range of from 0.1 to 5 wt. % versus the amount of the filler resin as the surface side filler.

In addition, the filler resin as the surface side filler may contain an appropriate thermaloxidation preventive (hereinafter referred to as antioxidant) in order for the filler resin to be maintained in a stable state under condition with a high temperature. For the amount of the antioxidant to be added for this purpose, it is desired to be in the range of from 0.1 to 1 part by weight versus 100 parts by weight of the filler resin as the surface side filler.

Such antioxidant can include monophenol series antioxidant, bisphenol series antioxidant, high-molecular phenol series antioxidant, sulphur series antioxidant, and phosphorous series antioxidant.

Specific examples of the monophenol series antioxidant are 2,6-di-tert-butyl-p-cresol, butylated hydroxyanisol, and 2,6-di-tert-butyl-4-ethylphenol.

Specific examples of the bisphenol series antioxidant are 2,2'-methylene-bis-(4-methyl-6-tert-butylphenol), 2,2'-methylene-bis-(4-ethyl-6-tert-butylphenol), 4,4'-thiobis-(3-methyl-6-tert-butylphenol), 4,4'-butylidene-bis-(3-methyl-6-tert-butylphenol), and 3,9-bis[1,1-dimethyl-2-{β-(3-tert-butyl-4-hydroxy-5-methylphenyl)propyonyloxy}ethyl]2,4,8,10-tetraoxaspyro[5,5]undecane.

Specific examples of the high-molecular phenol series antioxidant are 1,1,3-tris-(2-methyl-4-hydroxy-5-tert-butylphenyl)butane, 1,3,5-trimethyl-2,4,6-tris(3,5-di-tert-butyl- 4-hydroxybenzyl)benzene, tetrakis-{methylene-3-(3', 5'-di-tert-butyl-4'-hydroxyphenyl)propionate}methane, bis 3,3'-bis-(4'-hydroxy-3'-tert-butylphenyl)butyric acid glucose ester, 1,3,5-tris(3',5'-di-tert-butyl-4'-hydoxylbenzyl)-s-triazine-2,4,6-(1H,3H,5H)trion, and tocopherol (Vitamin E).

Specific examples of the sulphur series antioxidant are dilaurylthiodipropionate, dimyristylthiodipropionate, and distearylthiopropionate.

Specific examples of the phosphorous series antioxidant are triphenylphosphate, diphenylisodecylphosphate, phenyldiisodecylphosphate, 4,4'-butylidene-bis-(3-methyl-6-tert-butylphenyl-di-tridecyl)phosphate, cyclicneopentanetetrabis(octadecylphosphate), tris(mono or di)phenylphosphate, diisodecylpentaerythritoldiphosphate, 9,10-dihydro-9-oxa-10-phosphenanthrene-10-oxide, 10-(3, 5-di-tert-butyl-4-hydroxybenzyl)-9,10-dihydro-9-oxa-10-phosphenanthrene-10-oxide, 10-decyloxy-9,10-dihydro-9-oxa-10-phosphenanthrene, cyclicneopentanetetrabis(2,4-di-tert-butylphenyl)phosphate, cyclicneopentanetetrabis(2,6-di-tert-methylphenyl)phosphate, and 2,2-methylenebis(4,6-tert-butylphenyl)octylphosphate.

These antioxidants may be used either singly or in combination of two or more of them.

Further, in order to attain a further improved weatherability for the surface side filler so that it can be further effectively prevented from suffering from light degradation and also in order to effectively protect a layer situated under the surface side filler, the filler resin as the surface side filler may contain an appropriate UV absorber. For the amount of the UV absorber to be added, it is desired to be in the range of from 0.1 to 0.5 part by weight versus 100 parts by weight of the filler resin.

As such UV absorber, there can be used chemical compounds usable as an UV absorber. As such chemical compound, there can be mentioned salicylic acid series compounds, benzophenone series compounds, benzotriazole series compounds, and cyanoacrylate series compounds.

Specific examples of such salicylic acid series compound are phenylsalicylate, p-tert-butylsalicylate, and p-octylphenylsalicylate.

Specific examples of such benzophenone series compound are 2,4-dihydroxybenzophenone, 2-hydroxy-4-methoxybenzophenone, 2-hydroxy-4-octoxybenzophenone, 2-hydroxy-4-dodecyloxybenzophenone, 2,2'-dihydroxy-4-methoxybenzophenone, 2,2'-dihydroxy-4,4'-dimethoxybenzophenone, 2-hydroxy-4-methoxy-5-sulfobenzophenone, and bis(2-methoxy-4-hydroxy-5-benzophenone)methane.

Specific examples of such benzotriazole series compound are 2-(2'-hydroxy-5'-methylphenyl)benzotriazole, 2-(2'-hydroxy-5'-tert-butylphenyl)benzotriazole, 2-(2'-hydroxy-3',5'-di-tert-butylphenyl)benzotriazole, 2-(2'-hydroxy-3'-tert-butyl-5-methylphenyl)-5-chlorobenzotriazole, 2-(2'-hydroxy-3',5'-di-tert-butylphenyl)-5-chlorobenzotriazole, 2-(2'-hydroxy-3',5'-di-tert-amylphenyl)benzotriazole, 2-[2'-hydroxy-3'-(3",4",5",6"-tetrahydrophthalimidomethyl)-5'-methylphenyl)]benzotriazole, and 2,2-methylenebis[4-(1,1,3,3-tetramethylbutyl)-6-(2H-benzotriazole-2-yl)phenol].

Specific examples of such cyanoacrylate series compound are 2-ethylhexyl-2-cyano-3,3'-diphenylacrylate, and ethyl-2-cyano-3,3'-dephenylacrylate.

These compounds as the UV absorber may be used either singly or in combination of two or more of them.

Besides the UV absorber, it is possible for the filler resin as the surface side filler to contain an appropriate hindered amine series photo stabilizer in order to impart an improved weatherability to the surface side filler.

Although the hindered amine series photo stabilizer does not absorb ultraviolet rays as the UV absorber does, a pronounced advantage is provided by using the hindered amine series photo stabilizer in combination with the UV absorber.

For the amount of the hindered amine series photo stabilizer to be added, it is desired to be in the range of from 0.1 to 0.3 part by weight versus 100 parts by weight of the filler resin as the surface side filler.

Besides the hindered amine series photo stabilizer, there are known other photo stabilizers. However, these photo stabilizers are not desirable to use in the surface side filler because they are mostly colored.

Specific examples of the above hindered amine series photo stabilizer are succinic acid dimethyl-1-(2-hydroxyethyl)-4-hydroxy-2,2,6,6-tetramethylpiperidine polycondensation product, poly[{6-{(1,1,3,3-tetramethylbutyl)amino-1,3,5-triazine-2,4-diyl}{(2,2,6,6-tetramethyl-4-piperidylimino}hexamethylene}{2,2,6,6-tetramethyl-4-piperidyl)imino}], N,N'-bis(3-aminopropyl) ethylenediamine-2,4-bis[N-butyl-N-(1,2,2,6,6-pentamethyl-4-piperidyl)amino]-6-chloro-1,3,5-triazine polycondensation product, bis(2,2,6,6-tetramethyl-4-piperidyl)sebalate, and 2-(3,5-di-tert-butyl-4-hydroxybenzyl)-2-n-butylmalonic acid bis(1,2,2,6,6-pentamethyl-4-piperidyl).

Incidentally, with consideration of use environmental conditions for a solar cell module in which the foregoing surface side filler is used, any of the above-described UV absorber, photo stabilizer and antioxidant is desired to be low in volatility.

In the case where a solar cell module is used under severe environmental conditions, it is desired to have a marked adhesion not only between the surface side filler and the photovoltaic element but also between the surface side filler and the surface protective film.

In order for the surface side filler to attain such adhesion, it is effective to incorporate an appropriate silane coupling agent or organic isocyanate into the filler resin as the surface side filler.

Specific examples of such silane coupling agent are are vinyltrichlorosilane, vinyltris(β-methoxy)silane, vinyltriethoxysilane, vinyltrimethoxysilane, γ-methacryloxypropyltrimethoxy silane, β-(3,4-epoxycyclohexyl)ethyltrimethoxysilane, γ-glycidoxypropylmethyldiethoxysilane, N-β(aminoethyl)γ-aminopropyltrimethoxysilane, N-β(aminoethyl)γ-aminopropylmethyldimethoxysilane, γ-aminopropyltriethoxysilane, N-phenyl-γ-aminopropyltrimethoxysilane, γ-mercaptopropyltrimethoxysilane, and γ-chloropropyltrimethoxysilane.

Now, in order to prevent a decrease in the quantity of incident light to be arriving in the photovoltaic element, the surface side filler is desired to be substantially transparent. Specifically, it is desired for the surface side filler to have a light transmittance of preferably 80% or more or more preferably 90% or more in a visible light wavelength region of 400 nm to 800 nm. Further, in order to facilitate external light to be readily impinged into the photovoltaic element, the surface side filler is made such that it has a refractive index of preferably 1.1 to 2.0 or more preferably 1.1 to 1.6 at a temperature of 25° C.

Thin Resin Layer

The thin resin layer 102 is disposed on the light receiving face of the photovoltaic element 101 such that at least the collecting electrode 108 is covered by the transparent resin layer in a state that gaps present in the collecting electrode are sufficiently filled by the transparent resin layer so that even when moisture should be invaded from the surface of the solar cell module, the moisture is prevented from entering into the collecting electrode while also preventing it from invading into the photovoltaic element. Hence, the thin resin layer 102 is required to excel in transparency and in addition, it is required to be high in moisture resistance and sufficiently low in moisture permeability. Particularly, the thin resin layer is desired to have a moisture permeability of 0.01 to 20 g/m².day or less in an atmosphere of 40° C. and 90% RH.

In addition, for the thin resin layer, it is required not to behave such that it hinders light to be arriving in the photovoltaic element. For this purpose, it is desired for the thin resin layer to have a light transmittance of preferably 80% or more or more preferably 90% or more in a visible light wavelength region of 400 nm to 800 nm. Further, in order to facilitate external light to be readily impinged into the photovoltaic element, the thin resin layer is made such that it has a refractive index of preferably 1.1 to 2.0 or more preferably 1.1 to 1.6 at a temperature of 25° C.

The thin resin layer 102 may be comprised of a resin material selected from the group consisting of acrylic resins, silicone resins, fluorine-containing resins and mixtures of these resins and inorganic compounds such as inorganic polymers. The inorganic polymer herein can include organosiloxane polymers.

In order for the thin resin layer 102 to have a sufficient moisture resistance, the thin resin layer is desired to comprise a cured film having a crosslinked network molecular structure therein. Such cured film may be formed by way of moisture curing, curing with the use of an isocyanate, or heat curing with the use of a blocked isocyanate. In a preferred embodiment, the thin resin layer is formed by thermally crosslinking an acrylic resin and an inorganic polymer comprising an organosiloxane polymer with a isocyanate blocked by a blocking agent. For the blocking agent, it is desired to have a dissociation temperature of 80° C. to 220° C. When the dissociation temperature is less than 80° C., the resulting resin is liable to be short in pot. When the dissociation temperature is beyond 220° C., the constituents including acrylic resin of the resulting resin are liable to thermally deteriorate and color, resulting in imparting negative influences to the photovoltatic element. For the blocking agent after having thermally dissociated, it is partially remained in the resulting resin and therefore, it is necessary to selectively use an adequate blocking agent which does not cause coloration with the constituents of the resulting resin even if the resulting resin should contain a residue of the blocking agent therein. In order for the thin resin layer to have an improved adhesion, it is possible to use a silane series, titanium series or aluminum series coupling agent in an amount of 0.05 to 10 wt. % versus the amount of the resin components. In a preferred embodiment, a silane series coupling agent is used in an amount of 0.05 to 8.0 wt. % versus the amount of the resin components.

The formation of the thin resin layer on the photovoltaic element may be conducted, for example, by a manner of applying a given coating liquid onto the photovoltaic element by the conventional spray coating, spin coating or curtain coating process, followed by subjecting drying to remove the solvent, then subjecting to curing treatment. In this case, the thin resin layer is formed on the light receiving surface of the photovoltaic element in such a state that gaps present in the electrically conductive coat of the collecting electrode are desirably filled by the thin resin layer.

Back Side Filler

The backside filler 105 serves to attain a sufficient adhesion between the photovoltaic element 101 and the insulating film 106 (or the back face protective film). In the case where the back face reinforcing member 107 is used, it serves serves to attain a sufficient adhesion between the insulating film 106 and the back face reinforcing member 107. The backside filler 105 is desired to comprise a material capable of sufficiently ensuring the adhesion between the electrically conductive substrate of the photovoltaic element 101 and the insulating film 106 and which excels in durability, withstands a thermal expansion and thermal contraction, and excels in flexibility. Specific examples of such material are hot-melt materials such as EVA, EEA, and polyvinyl butyral, and epoxy adhesives having flexibility. Besides these, double-coated tapes may be also usable.

Alternatively, the backside filler 105 may comprise the same resin material used for the surface side filler 103.

Insulating Film

The insulating film 106 (or the back face protective film) is disposed for the purpose of electrically isolating the electrically conductive substrate of the photovoltaic element 101 from the outside. The insulating film 106 is desired to be composed of a material which can sufficiently electrically isolating the electrically conductive substrate of the photovoltaic element, and excels in durability, withstands a thermal expansion, thermal contraction, and flexibility. Specific examples of such material are polyolefin series resin, acrylic series resins, styrene series resins, nylon, and polyethylene terephthalate (PET).

Back Face Reinforcing Member

In the present invention, the back face reinforcing member 107 is not always necessary to be used. It may be used in case where it is necessary to be used, for instance, depending upon the location where it is installed. As shown in FIG. 2, the back face reinforcing member 107 is disposed outside the insulating film 106 through the back side filler 105. The back face reinforcing member 107 is used in order to improve the physical strength of the solar cell module and in order to prevent the solar cell module from being distorted or warped due to changes in environmental temperature. The back face reinforcing member may comprise a steel plate, a plastic plate, or a fiber-glass reinforced plastic plate (or a so-called FRP plate).

Production of Solar Cell Module

Description will be made of a manner of producing a solar cell module according to the present invention, using the foregoing photovoltaic element, transparent organic polymer resins, and surface protective film.

To coat the light receiving face of the photovoltaic element 101 by the surface side filler 103 may be conducted by (a) a manner of applying a coating liquid comprising a filler material dissolved in a solvent onto the surface of a photovoltaic element and vaporizing the solvent of the coating liquid applied, (b) a manner of uniformly depositing a powdery filler material on the surface of a photovoltaic element and subjecting the powdery filler material deposited to heat fusion, (c) a manner of providing a heat-fused product of a filler material and applying the heat-fused product onto the surface of a photovoltaic element through a slit, or (d) a manner of providing a sheet of a filler material obtained using a heat-fused product of the filler material and laminating the sheet on the surface of a photovoltaic element by way of thermocompression bonding.

In the case of the manner (a), one or more of the forgoing organic peroxide, silane coupling agent, UV absorber, antioxidant and the like are firstly mixed with the solvent prior to dissolving the filler material therein. The resultant is applied onto the surface of the photovoltaic element, followed by drying. In the case of any of the manners (b) and (c), these additives are firstly mixed with the starting filler material.

In the case where a surface side filler 103 is firstly formed on the surface of a photovoltaic element 101, there is obtained a stacked body by laminating a surface protective film 104 on the light receiving face side of the photovoltaic element and laminating a back side filler 105 and an insulating film 106 in this order on the rear face of the photovoltaic element, and the stacked body is subjected to thermocompression bonding treatment, whereby a solar cell module can be obtained. In the case where a back face reinforcing member 107 is intended to dispose, it can be laminated on the insulating film 106 by means of an adhesive (a back side filler 105). The lamination in this case may be conducted upon conducting the above thermocompression bonding treatment or it may be independently conducted by an appropriate lamination means.

In the case where a sheet-like surface side filler is used, upon obtaining the stacked body in the above manner, it is interposed between the photovoltaic element and the surface protective film, followed by subjecting to the thermocompression bonding treatment, whereby a solar cell module can be obtained.

The thermocompression bonding treatment may be conducted by the conventional vacuum lamination process, roll lamination process, or the like.

In the following, the present invention will be described in more detail with reference to examples which are only for illustrative purposes and not intended to restrict the scope of the present invention.

EXAMPLE 1

Figure 5:
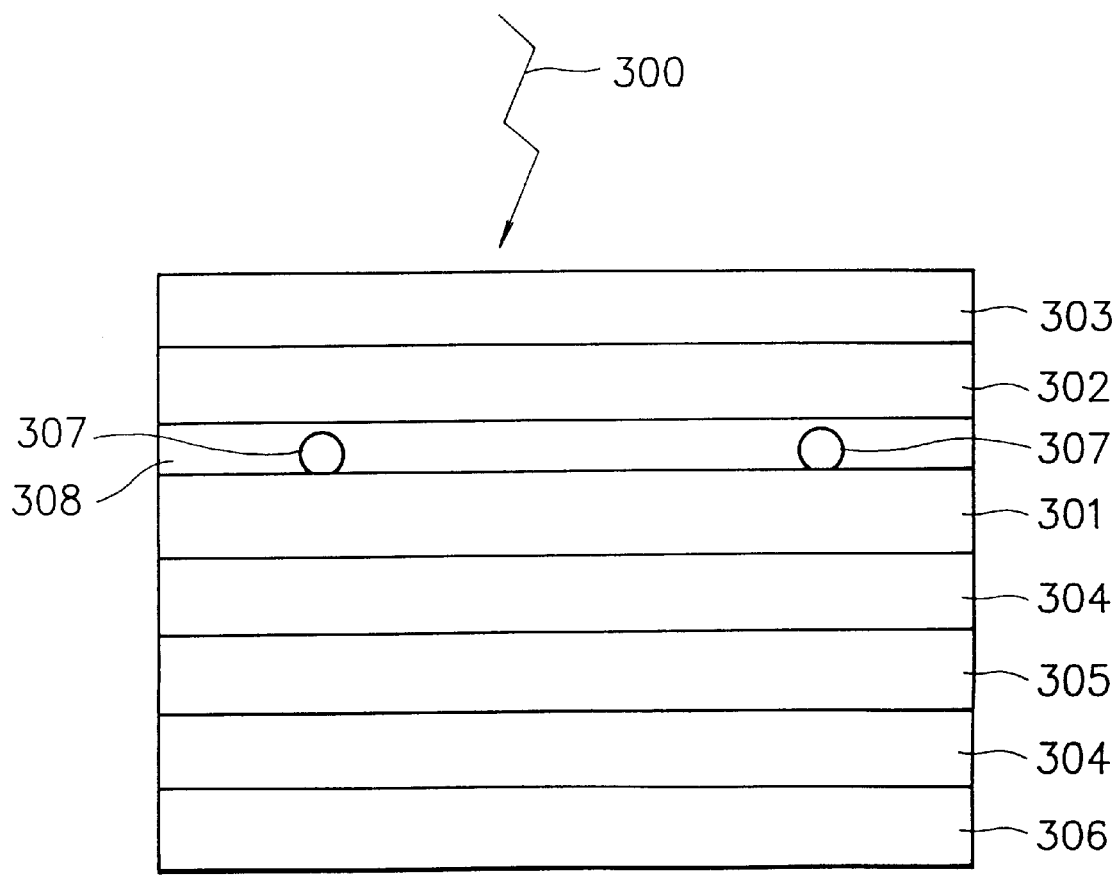
FIG. 5 is a schematic cross-sectional view illustrating another example of a solar cell module according to the present invention.

In this example, there was prepared a solar cell module having the configuration shown in FIG. 5 which comprises a photovoltaic element 301 (a solar cell) provided with a collecting electrode 307 having such a configuration as shown FIG. 4 in that the collecting electrode comprising a metallic wire as a core coated by an electrically conductive coat, wherein a specific transparent resin layer 308 having a relatively thin thickness, a surface side filler 302 and a surface protective film 303 are stacked in the named order on the front face side of the photovoltaic element 301, and a first back side filler 304, a insulating film 305 (or a back face protective film), a second back side filler 304, and a back face reinforcing member 306 are stacked in the named order on the rear face side of the photovoltaic element 301. And the exposed face of the collecting electrode 307 is covered by the transparent resin layer 308 such that gaps present in the electrically conductive coat are filled by the transparent resin layer. In FIG. 5, reference numeral 300 indicates light to be impinged into the solar cell module.

The solar cell module was prepared in the following manner.

1. As the photovoltaic element 301, there was provided a photovoltaic element having the constitution shown in FIG. 3. The photovoltaic element was prepared in the following manner.

(1). Preparation of a collecting electrode as the collecting electrode 307 shown in FIG. 5

First, there was provided a metallic wire made of Cu wound on a pay-out reel.

Then, there was prepared an electrically conductive paste to be used for coating the metallic wire as follows. A mixed solvent composed of 2.5 g of ethyl acetate and 2.5 g of isopropyl alcohol was introduced into a dispersing and shaking vessel and 22.0 g of a urethane resin as a main component was added to the mixed solvent, followed by well-mixing using a ball mill. Then, 1.1 g of a blocked isocyanate and 10 g of a dispersing glass were added to the mixture in the dispersing and shaking vessel, followed by adding 2.5 g of a carbon black powder having a average primary particle size of 0.05 $\mu$m (as an electrically conductive material) to the mixture in the dispersing and shaking vessel. Thereafter, the dispersing and shaking vessel was shaken for 10 hours by means of a paint shaker (produced by Tohyoseiki Seisakusho Kabushiki Kaisha) to produced a paste in which the fine particles of the carbon black as the electrically conductive material are well dispersed in the dispersing and shaking vessel. The resultant paste was taken out from the dispersing and shaking vessel, and the dispersing glass was removed from the paste. By this, there was obtained a electrically conductive paste.

The above metallic wire was coated by the resultant electrically conductive paste using a conventional wire coater in the following manner. The metallic wire wound on the pay-out reel was delivered and the metallic wire delivered was successively taken up on a take-up reel, where the wire coater was operated to continuously apply the electrically conductive paste to the metallic wire moving from the pay-out reel toward the take-up reel while drying and curing the electrically conductive paste applied on the metallic wire.

By this, there was obtained an collecting electrode having a core comprising the Cu-wire which is coated by an electrically conductive material. The resultant collecting electrode was cut to obtain a plurality of collecting electrodes.

(2). Preparation of a photovoltaic element

There was firstly provided a well-cleaned stainless steel plate as a substrate. On the substrate, there was formed a two-layered back reflecting layer comprising a 5000 Å thick Al film and a 5000 Å thick ZnO film by means of a conventional sputtering process, followed by forming, on the back reflecting layer, a tandem type photoelectric conversion semiconductor layer with a nip/nip structure comprising a 150 Å thick n-type layer/a 4000 Å thick i-type layer/a 100 Å thick p-type layer/a 100 Å thick n-type layer/a 800 Å thick i-type layer/a 100 Å thick p-type layer being laminated in the named order from the substrate side by means of a conventional plasma CVD manner, wherein an n-type a-Si film as each n-type layer was formed from a mixture of $SiH_4$ gas, $PH_3$ gas and $H_2$ gas; an i-type a-Si film as each i-type layer was formed from a mixture of $SiH_4$ gas and $H_2$ gas; and a p-type $\mu$c-Si film as each p-type layer was formed from a mixture of $SiH_4$ gas, $BF_3$ gas and $H_2$ gas. Then, on the photoelectric conversion semiconductor layer, there was formed a 700 Å thick $In_2O_3$ film as a transparent and electrically conductive layer by means of a conventional heat resistance evaporation process wherein an In-source was evaporated in an $O_2$ atmosphere.

On the surface of the transparent and electrically conductive layer, the collecting electrodes obtained in the above step (1) were arranged at an equal interval, followed by subjecting to thermocompression treatment, whereby the collecting electrodes were fixed on the surface of the transparent and electrically conductive layer.

The collecting electrodes thus formed on the transparent and electrically conductive layer were connected in series by bonding a wire bus bar to the collecting electrodes. For the resultant, a copper tub as a negative side power outputting terminal was fixed to the substrate by means of a solder and a tape of a tin foil as a positive side power outputting terminal was fixed to the collecting electrode.

In this way, there was obtained a photovoltaic element (a solar cell) used as the photovoltaic element 301.

2. Formation of thin resin layer

The thin resin layer 308 was formed in the following manner.

52 parts by weight of an acrylic resin comprising 2-hydroxyethyl methacrylate, 30 parts by weight of hexamethylenediisocyanate blocked by $\epsilon$-caprolactam, 13 parts by weight of organosiloxane polymer, and 5 parts by weight of $\gamma$-glycidoxypropyltrimethoxysilane were admixed in a mixed solvent composed of xylene and methylisobutyl ketone with a mixing ratio of 1:1 to obtain a coating liquid having a resin content of 35 wt. %. The coating liquid was applied onto the light receiving face of the photovoltaic element 301 obtained in the above step 1 in an amount to provide a thickness of 25 $\mu$m when cured, by means of a conventional spray coating process so as to cover the collecting electrodes 307, and the coating liquid applied on the photovoltaic element was dried at room temperature for 15 minutes, followed by subjecting to curing treatment at 200° C. for 10 minutes. By this, there was formed a 25 $\mu$m thick transparent resin layer as the transparent resin layer 308 on the light receiving face of the photovoltaic element so as to cover the collecting electrodes.

3. As each of the surface side filler 302 and the first and second back side fillers 304, there was provided a 460 $\mu$m thick resin sheet prepared in the following manner.

100 parts by weight of an EVA (ethylene-vinyl acetate copolymer, vinyl acetate content: 33 wt. %, melt flow rate: 30 dg/min.), 1.5 parts by weight of 2,5-dimethyl-2,5-bis(t-butylperoxy)hexane as a crosslinking agent, 0.3 part by weight of 2-hydroxy-4-n-octoxybenzophenone as an UV absorber, 0.2 part by weight of tris(mono-nonylphenyl) phosphate as an antioxidant, and 0.1 part by weight of (2,2,6,6-tetramethyl-4-piperidyl)sebacate as a photo stabilizer were well mixed, followed by impregnating a glass fiber. The resultant was subjected to T-die extrusion, to thereby obtain a 460 um thick resin sheet.

In this way, there were obtained three resin sheets having a thickness of 460 um used as the surface side filler 302 and the first and second back side fillers 304.

4. As the surface protective film 303, there was provided a 50 um thick nonoriented ethylene-tetrafluoroethylene copolymer (ETFE) film having a surface applied with corona discharge treatment to be contacted with the surface side filler 302.

5. As the insulating film 305, there was provided a 50 um thick nylon film (trademark name: DARTEC, produced by Du Pont Company) having opposite surfaces applied with corona discharge treatment.

6. As the back face reinforcing member 306, there was provided a 0.27 mm thick galvernized steel plate (trademark name: TAIMACOLAR, produced by Daidokohan Kabushiki Kaisha).

7. Preparation of a solar cell module

On the surface of an aluminum plate, there were stacked the galvernized steel plate as the back face reinforcing member 306, the resin sheet as the second back side filler 304, the nylon film as the insulating film 305, the resin sheet as the first back side filler 304, the photovoltaic element 301 having the thin resin layer formed thereon, the resin sheet as the surface side filler 302, and the ETFE film as the surface protective film 303 in the named order to form a stacked body. Successively, there was superposed a heat resistant silicone rubber sheet over the stacked body so as to enclose the stacked body. And the space containing the stacked body between the aluminum plate and the silicone rubber sheet was sealed using an O-ring (the body established herein will be referred to as lamination instrument). Then, using a vacuum pump, said space containing the stacked body was vacuumed so that the inside of the stacked body became 10 mmHg. After the inside of the stacked body was sufficiently vacuumed, the lamination instrument was introduced into a furnace maintained at 150° C. and it was maintained for 45 minutes, under condition of continuing the vacuuming operation. Thereafter, while still continuing the vacuuming operation, the lamination instrument was taken out from the furnace, followed by cooling to room temperature.

Thereafter, the inside pressure of the lamination instrument was returned to atmospheric pressure to obtain a vacuum-treated stacked body. Thus, there was obtained a solar cell module.

The above procedures were repeated to obtain a plurality of solar cell modules.

Herein, one of the solar cell module was randomly selected, and for the solar cell module, examination was conducted whether or not gaps present in the electrically conductive coat of each of the collecting electrodes 307 by the thin resin layer 308. As a result, it was found that the gaps present in the electrically conductive coat of each collecting electrode are sufficiently filled by the transparent resin layer.

Evaluation

Using the resultant solar cell modules, evaluation was conducted with respect to (1) initial characteristics, (2) heat resistance, (3) moisture resistance, (4) scratch resistance, (5) weatherability, and (6) electric insulating property.

The evaluated results obtained are collectively shown in Table 1.

The evaluation of each of the above evaluation items was conducted in the following manner.

(1) Evaluation of the initial chracteristics

Using a solar cell simulator (AM 1.5), the solar cell module was subjected to irradiation of pseudo sunlight with 100 mW/cm$^2$, where its initial characteristics were examined. The examined result obtained was compared with that of the photovoltaic element not having converted into a module. The compared result is shown in Table 1 on the basis following criteria:

⊚: a case where a slight change is found, and

◯: a case where a distinguishable change is found but it is acceptable in practice.

(2) Evaluation of the heat resistance

The solar cell module was exposed to an atmosphere of 150° C. for 15 hours, and thereafter, its exterior appearance was observed. The observed result is shown in Table 1 on the basis of the following criteria:

⊚: a case where no substantial change is found, and

◯: a case where a slight change is found but it is acceptable in practice.

(3) Evaluation of the moisture resistance (i) Using a solar cell simulator (AM 1.5), pseudo sunlight with 100 mW/cm$^2$ was irradiated to the light receiving face side of the solar cell module for 24 hours while its bottom area being immersed in water, and thereafter, its characteristics were examined. The examined result obtained was compared with that obtained for the solar cell module before the test.

(ii) The solar cell module was maintained in an atmosphere of 85° C./85% RH for 10 hours, and thereafter, a reverse bias of 0.85 V was applied to the solar cell module for 10 hours. Thereafter, its characteristics were examined. The examined result obtained was compared with that obtained for the solar cell module before the test.

Based on the results obtained in the above (i) and (ii), there were observed solar cell module characteristics in terms of an increase in the series resistance (Rs) and a decrease in the shunt resistance (Rsh).

The observed result is shown in Table 1 on the basis of the following criteria:

◯: a case where a slight deterioration in the solar cell module characteristics is found, and X: a case where a remarkable deterioration in the solar cell module characteristics is found and it is not acceptable in practice.

(4) Evaluation of the scratch resistance

A 1 mm thick carbon steel plate was contacted through a corner thereof to an irregularities-bearing portion of the surface of the solar cell module, and the carbon steel plate was then pulled while applying a load of 2 pounds to the carbon steel plate to form a scratch. The solar cell module thus treated was evaluated of whether or not its scratched portion of the surface cover is still electrically insulative in isolating the photovoltaic element from the outside. This evaluation was conducted by immersing the treated solar cell module in an electrolyte solution of 3000 Ω.cm, and applying a voltage of 2200 V between the photovoltaic element of the solar cell module and the electrolyte solution to observe a leakage current occurred. The evaluated result is shown in Table 1 on the basis of the following criteria:

◯: a case where the leakage current is 50 μA or less, and

X: a case where the leakage current is apparently beyond 50 μA.

(5) Evaluation of the weatherability

The solar cell module was placed in a carbon-arc sunshine weather meter, where it was irradiated with pseudo sunlight for 5000 hours under conditions of alternately repeating a cycle of maintaining at a black panel temperature of 63° C. for 108 minutes and a cycle of pure water fall for 12 minutes. Thereafter, its exterior appearance was observed.

The observed result is shown in Table 1 on the basis of the following criteria:

◯: a case where no substantial change is found, and

X: a case where the occurrence of a defect of hindering the reliability such as layer peeling, crack or the like is found.

(6) Evaluation of the electric insulating property

The surface side of the solar cell module was maintained in an atmosphere of 85° C./85% RH for 1000 hours, followed by electrically connecting the positive and negative side terminals by means of a connection cable to short-circuit them. The solar cell module thus treated was immersed in an electrolyte solution having an electric conductivity of 3000 Ω.cm contained in a vessel having a counter electrode arraged therein, the connection cable was electrically connected to a terminal of a D.C. power source and the remaining terminal of the D.C. power source was electrically connected to the counter electrode, and the D.C. power was switched on to apply a D.C. voltage of 2200 V, where an electric current flown (a leakage current) was measured. The measured result is shown in Table 1 on the basis of the following criteria:

◯: a case where the leakage current is 50 μA or less, and

X: a case where the leakage current is apparently beyond 50 μA.

EXAMPLE 2

The procedures of Example 1 were repeated, except that the Cu-wire as the core of the collecting electrode was replaced by an Ag-clad wire, to thereby obtain a plurality of solar cell modules.

Using the resultant solar cell modules, evaluation was conducted with respect to initial characteristics, heat resistance, moisture resistance, scratch resistance, weatherability, and electric insulating property in the same manner as in Example 1.

The evaluated results obtained are collectively shown in Table 1.

EXAMPLE 3

The procedures of Example 1 were repeated, except that the Cu-wire as the core of the collecting electrode was replaced by an Al-clad wire, to thereby obtain a plurality of solar cell modules.

Using the resultant solar cell modules, evaluation was conducted with respect to initial characteristics, heat resistance, moisture resistance, scratch resistance, weatherability, and electric insulating property in the same manner as in Example 1.

The evaluated results obtained are collectively shown in Table 1.

EXAMPLE 4

The procedures of Example 1 were repeated, except that the blocked isocyanate in the formation of the thin resin layer in the step 2 was replaced by 1,3-bis(isocyanatomethyl)cyclohexane blocked by ε-caprolactam, to thereby obtain a plurality of solar cell modules.

Using the resultant solar cell modules, evaluation was conducted with respect to initial characteristics, heat resistance, moisture resistance, scratch resistance, weatherability, and electric insulating property in the same manner as in Example 1.

The evaluated results obtained are collectively shown in Table 1.

EXAMPLE 5

The procedures of Example 1 were repeated, except that 2,5-dimethyl-2,5-bis(t-butylperoxy)hexane as the crosslinking agent for the EVA in the step 3 and the thermocompression treatment in the step 7 was conducted at 150° C. for 100 minutes, to thereby obtain a plurality of solar cell modules.

Using the resultant solar cell modules, evaluation was conducted with respect to initial characteristics, heat resistance, moisture resistance, scratch resistance, weatherability, and electric insulating property in the same manner as in Example 1.

The evaluated results obtained are collectively shown in Table 1.

EXAMPLE 6

The procedures of Example 1 were repeated, except that the blocked isocyanate in the formation of the thin resin layer in the step 2 was replaced by hexamethylenediisocyanate blocked by methyl ethyl ketone oxime, to thereby obtain a plurality of solar cell modules.

Using the resultant solar cell modules, evaluation was conducted with respect to initial characteristics, heat resistance, moisture resistance, scratch resistance, weatherability, and electric insulating property in the same manner as in Example 1.

The evaluated results obtained are collectively shown in Table 1.

COMPARATIVE EXAMPLE 1

The procedures of Example 1 were repeated, except that no thin resin layer was formed, to thereby obtain a plurality of solar cell modules.

Using the resultant solar cell modules, evaluation was conducted with respect to initial characteristics, heat resistance, moisture resistance, scratch resistance, weatherability, and electric insulating property in the same manner as in Example 1.

The evaluated results obtained are collectively shown in Table 1.

COMPARATIVE EXAMPLE 2

The procedures of Example 5 were repeated, except that no thin resin layer was formed, to thereby obtain a plurality of solar cell modules.

Using the resultant solar cell modules, evaluation was conducted with respect to initial characteristics, heat resistance, moisture resistance, scratch resistance, weatherability, and electric insulating property in the same manner as in Example 1.

The evaluated results obtained are collectively shown in Table 1.

COMPARATIVE EXAMPLE 3

The procedures of Example 2 were repeated, except that no thin resin layer was formed, to thereby obtain a plurality of solar cell modules.

Using the resultant solar cell modules, evaluation was conducted with respect to initial characteristics, heat resistance, moisture resistance, scratch resistance, weatherability, and electric insulating property in the same manner as in Example 1.

The evaluated results obtained are collectively shown in Table 1.

COMPARATIVE EXAMPLE 4

The procedures of Example 3 were repeated, except that no thin resin layer was formed, to thereby obtain a plurality of solar cell modules.

Using the resultant solar cell modules, evaluation was conducted with respect to initial characteristics, heat resistance, moisture resistance, scratch resistance, weatherability, and electric insulating property in the same manner as in Example 1.

The evaluated results obtained are collectively shown in Table 1.

TABLE 1

|  | initial characteristics | heat resistance | moisture resistance | scratch resistance | weatherability | electric insulating property |
| --- | --- | --- | --- | --- | --- | --- |
| Example 1 | ◉ | ◉ | ○ | ○ | ○ | ○ |
| Example 2 | ◉ | ◉ | ○ | ○ | ○ | ○ |
| Example 3 | ◉ | ◉ | ○ | ○ | ○ | ○ |
| Example 4 | ◉ | ◉ | ○ | ○ | ○ | ○ |
| Example 5 | ◉ | ○ | ○ | ○ | ○ | ○ |
| Example 6 | ○ | ○ | ○ | ○ | ○ | ○ |
| Comparative Example 1 | ○ | ○ | × | × | × | × |
| Comparative Example 2 | ○ | ○ | × | × | × | × |
| Comparative Example 3 | ○ | ○ | × | × | × | × |
| Comparative Example 4 | ○ | ○ | × | × | × | × |

Based on the results shown in Table 1, it is understood that the solar cell modules obtained in the foregoing examples belonging to the present invention in which the specific thin resin layer are sufficient enough in all the characteristics required for a solar cell module and therefore, they are highly reliable.

On the other hand, the solar cell modules obtained in the foregoing comparative examples in which the specific thin resin layer (used in the present invention) is not used are satisfactory in initial characteristics and heat resistance but they are apparently inferior in moisture resistance, scratch resistance, weatherability, and electric insulating property. Particularly, any of the solar cell modules obtained in the comparative examples is insufficient in moisture resistance in that when moisture is invaded from its surface, the moisture is liable to pass through the gaps present in the electrically conductive coat of the collecting electrode and reach the core comprising the metallic wire of the collecting electrode, where the metallic wire is oxidized by the moisture to cause an increase in the series resistance (Rs) or/and the surface of the core is ionized and migrated to cause a decrease in the shunt resistance (Rsh). In addition, as apparent from the results shown in Table 1, any of the solar cell modules obtained in the comparative examples in which the specific thin resin layer (used in the present invention) is not used is apparently inferior to any of the solar cell modules obtained in the examples belonging to the present invention in moisture resistance, scratch resistance, weatherability, and electric insulating property.

What is claimed is:

1. A solar cell module comprising a photovoltaic element having a light receiving face on which a collecting electrode comprising a metallic wire covered by an electrically conductive coat and a surface side cover comprising a filler of a copolymer of ethylene and an unsaturated acid ester and a surface protective film sequentially laminated on the light incident side of said photovoltaic element, wherein a resin layer comprising a resin material selected from the group consisting of an acrylic resin, a silicone resin, a fluorine-containing resin, mixtures thereof and an inorganic polymer is interposed between said photovoltaic element and said filler such that gaps present in said conductive coat of the collecting electrode are filled by said resin layer to prevent moisture invasion from damaging said metallic wire, wherein said resin layer has a moisture permeability of less than 20 g/m$^2$·day in an atmosphere of 40° C. and 90% RH.

2. A solar cell module according to claim 1, wherein the filler is crosslinked by an organic peroxide having an one-hour half life temperature of 100° C. to 300° C.

3. A solar cell module according to claim 1, wherein the filler comprises an ethylene-vinyl acetate copolymer.

4. A solar cell module according to claim 1, wherein the electrically conductive coat is formed of an electrically conductive paste.

5. A solar cell module according to claim 1, wherein the collecting electrode comprises a metallic wire and said metallic wire is coated by the electrically conductive coat.

6. A solar cell module according to claim 5, wherein the electrically conductive coat is formed of an electrically conductive paste.

7. A solar cell module according to claim 5, wherein the metallic wire has a surface composed of silver or copper.

8. A solar cell module according to claim 4 or 6, wherein the electrically conductive paste comprises electrically conductive particles and a binder resin.

9. A solar cell module according to claim 1, wherein the resin layer is formed by applying a coating liquid comprising said resin material, wherein said resin material is a transparent resin diluted by a solvent on the light incident side of the photovoltaic element and curing the coating liquid applied.

10. A solar cell module according to claim 1, wherein the electrically conductive coat has a thickness of 1 um to 100 um.

11. A solar cell module according to claim 1, wherein the resin layer has a thickness of 0.5 um to 150 um.

12. A solar cell module according to claim 1, wherein said resin material is a transparent organic resin.

13. A solar cell module according to claim 1, wherein the resin layer has a light transmittance of 80% or more in a visible light wavelength region of 400 nm to 800 nm.

14. A solar cell module according to claim 1, wherein the resin layer has a refractive index of 1.1 to 2.0 at a temperature of 25° C.

15. A solar cell module according to claim 1, wherein said resin material comprises a resin containing a silane coupling agent, said silane coupling agent present in an amount of 0.05 to 10 wt. % based on the total weight of the resin.

16. A solar cell module comprising: a photovoltaic element having a light receiving face on which a collecting electrode having an electrically conductive coat layer is disposed, wherein a first resin is provided at least in gaps present in said conductive coat layer and a second resin is provided on the light receiving face side of said photovoltaic element such that said collecting electrode and said first resin are covered by said second resin.

17. A solar cell module according to claim 16, wherein a surface protective film is provided on the second resin.

18. A solar cell module according to claim 16, wherein the first resin covers the light receiving face of the photovoltaic element.

19. A solar cell comprising a photovoltaic element having a light receiving face on which a collecting electrode having an electrically conductive coat, a surface side cover comprising a filler selected from the group consisting of ethylene-vinyl acetate copolymer, ethylenemethyl acrylate copolymer, ethylene-ethyl acrylate copolymer, ethylene-butyl acrylate copolymer, ethylene-methyl methacrylate copolymer and ethyene-ethyl methacrylate copolymer and a surface protective film are sequentially laminated, wherein a resin layer comprising a resin material selected from the group consisting of an acrylic resin, a silicone resin, a flourine-containing resin , mixtures thereof and an inorganic polymer is interposed between said photovoltaic element and said filler such that gaps present in said conductive coat of the collecting electrode are filled by said resin layer to prevent moisture invasion from damaging said collecting electrode, wherein said resin layer has a moisture permeability of less than 20 g/m$^2$●day in an atmosphere of 40° C. and 90% RH.

* * * * *

UNITED STATES PATENT AND TRADEMARK OFFICE
CERTIFICATE OF CORRECTION

PATENT NO. : 6,191,353 B1
DATED : February 20, 2001
INVENTOR(S) : Hidenori Shiotsuka et al.

It is certified that error appears in the above-identified patent and that said Letters Patent is hereby corrected as shown below:

Column 1,
Line 26, "a insulating member," should read -- an insulating member, --;
Line 46, "eternally" should read -- externally --; and
Line 55, "module" should read -- modules --.

Column 2,
Line 3, "manner)" should read -- process) --;
Line 36, "particles The" should read -- particles. The --;
Line 57, "precipitated, when" should read -- precipitated when --; and
Line 58, "migrates to" should read -- migrates and --.

Column 3,
Line 1, "invaded" should read -- invades --;
Line 43, "collecting" should read -- the collecting --;
Line 47, "contracts" should read -- contacts -- and "with" should be deleted.
Line 50, "photovotaic" should read -- photovoltaic --; and
Line 61, "side but" should read -- side, but --.

Column 4,
Line 2, "barely" should read -- is barely --;
Line 4, "member, inferior" should read -- member is inferior --; and
Line 11, "surface" should read -- surfaces --.

Column 6,
Line 8, "attain" should read -- attained --;
Line 39, "manner" should read -- process --; and
Line 40, "EVA maintained" should read -- EVA is maintained --.

Column 7,
Line 7, "bedetailed" should read -- be detailed --;
Line 27, "case" should read -- cases --; and
Line 28, "necesarry" should read -- necessary --.

Column 8,
Line 24, "will be detailed" should be deleted; and
Line 29, "escription" should read -- description --.

UNITED STATES PATENT AND TRADEMARK OFFICE
CERTIFICATE OF CORRECTION

PATENT NO.    : 6,191,353 B1
DATED         : February 20, 2001
INVENTOR(S)   : Hidenori Shiotsuka et al.

It is certified that error appears in the above-identified patent and that said Letters Patent is hereby corrected as shown below:

Column 10,
Lines 19 and 24, "entail" should read -- occur --;
Line 30, "it" should be deleted;
Line 31, "manner." should read -- manners. --;
Line 45, "terminal" should read -- terminals --;
Line 47, "Athernatively," should read -- Alternatively, --.

Column 12,
Lines 21 and 28, "entail" should read -- occur --;
Line 24, "maintained" should read -- is maintained --;
Line 36, "t-butylperoxyisobutylcanboate," should read -- t-butylperoxyisobutylcarbonate, --
Lines 37-38, "di-t-butylperoxyhexahydrotetrephthalate." should read -- di-t-butylperoxyhexahydroterephthalate. --.

Column 14,
Line 50, "poly[{6-{(1,1,3,3-" should read -- poly[{6-(1,1,23,3 --

Column 15,
Line 38, "be invaded" should read -- invade --; and
Line 46, "20 g/m$^2$.day" should read -- 20 g/m$^2$.day --.

Column 16,
Line 31, "subjecting" should read -- subjecting to --;
Line 64, "isolating" should read -- isolate --;
Line 66, "expansion," should read -- expansion and -- "and" should read -- and excels in --.

Column 17,
Line 23, "To coat" should read -- Coating of --.

Column 18,
Line 49, "a" (second occurrence" should read -- an --; and
Line 53, "produced" should read -- produce --.

Column 19,
Line 4, "an" should read -- a --.

UNITED STATES PATENT AND TRADEMARK OFFICE
CERTIFICATE OF CORRECTION

PATENT NO.   : 6,191,353 B1
DATED        : February 20, 2001
INVENTOR(S)  : Hidenori Shiotsuka et al.

It is certified that error appears in the above-identified patent and that said Letters Patent is hereby corrected as shown below:

Column 20,
Line 40, "as" should read -- as the --;
Line 56, "module" should read -- modules --; and
Line 58, "present" should read -- are present --.

Column 21,
Line 59, "of" should read -- as to --

Column 25,
Line 9, "is invaded" should read -- invades --.
Line 42, "an" (second occurrence) should read -- a --.

Column 26,
Line 42, "ethylenemethyl" should read -- ethylene-methyl --; and
Line 55, "20 g/m m2•day" should read -- 20g/m2.day --.

Signed and Sealed this

Twelfth Day of March, 2002

Attest:

*Attesting Officer*

JAMES E. ROGAN
*Director of the United States Patent and Trademark Office*